(12) United States Patent
Ng

(10) Patent No.: US 8,710,928 B2
(45) Date of Patent: Apr. 29, 2014

(54) SEMICONDUCTOR POWER AMPLIFIER

(75) Inventor: Choon Yong Ng, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/346,037

(22) Filed: Jan. 9, 2012

(65) Prior Publication Data

US 2012/0319778 A1 Dec. 20, 2012

(30) Foreign Application Priority Data

Jun. 17, 2011 (JP) ................. P2011-135157

(51) Int. Cl.
*H03F 3/14* (2006.01)

(52) U.S. Cl.
USPC .......................... 330/307; 330/295

(58) Field of Classification Search
USPC ............... 330/124 R, 277, 295, 307
See application file for complete search history.

(56) References Cited

U.S. PATENT DOCUMENTS

| | | | |
|---|---|---|---|
| 5,111,157 A | 5/1992 | Komiak | |
| 6,606,000 B2 * | 8/2003 | Kato et al. | 330/307 |
| 7,777,571 B2 * | 8/2010 | Gotou et al. | 330/295 |
| 2006/0044067 A1 * | 3/2006 | Suzaki et al. | 330/295 |
| 2009/0237166 A1 * | 9/2009 | Gotou et al. | 330/295 |

FOREIGN PATENT DOCUMENTS

| | | |
|---|---|---|
| EP | 1 739 736 A1 | 1/2007 |
| JP | 11-260833 A | 9/1999 |
| JP | 2000-332030 | 11/2000 |
| JP | 2005-26327 A | 1/2005 |

OTHER PUBLICATIONS

Japanese Office Action Issued Jan. 29, 2013 in Patent Application No. 2011-135157 (with excerpt of English translation).
Search Report issued Dec. 2, 2013, in European Patent Application No. 1215 0287.6.

* cited by examiner

*Primary Examiner* — Khanh V Nguyen
(74) *Attorney, Agent, or Firm* — Oblon, Spivak, McClelland, Maier & Neustadt, L.L.P.

(57) ABSTRACT

A semiconductor power amplifier of an embodiment includes: a plurality of unit FETs disposed in parallel in a direction of a substantially straight line connecting source electrodes of the unit FETs; a first via hole which connects the two source electrodes positioned between adjacent ones of the unit FETs in common and an RF ground electrode; and a second via hole which connects the source electrode on a side having no adjacent unit FET and the RF ground electrode. Each unit FET includes: a gate electrode which connects gate finger electrodes and leads out the gate finger electrodes; a drain electrode which connects drain finger electrodes disposed facing the gate finger electrodes and leads out the drain finger electrodes; and two source electrodes which connects source finger electrodes disposed facing the gate finger electrodes and lead out the source finger electrodes to opposing sides in a widthwise direction thereof.

9 Claims, 8 Drawing Sheets

SEMICONDUCTOR POWER AMPLIFIER

CROSS-REFERENCE TO RELATED APPLICATION

This application is based upon and claims the benefit of priority from the prior Japanese Patent Application No. 2011-135157, filed on Jun. 17, 2011, the entire contents of which are incorporated herein by reference.

FIELD

Embodiments of the invention relate to a semiconductor power amplifier configured to amplify a radio frequency (RF) signal.

BACKGROUND

A high-output semiconductor power amplifier employing an MMIC technique conventionally includes: dividers configured to divide an input signal; an amplifier configured by connecting a plurality of unit FETs (FET: Field Effect Transistor) in parallel at a plurality of stages; and combiners configured to combine the outputs from the amplifier and output the resultant signal. The amplifier of this type can achieve a high amplification factor and a high output while maintaining a fine linearity. The high-output semiconductor power amplifier generally uses unit FETs with a multi-finger structure to fulfill the need for a wide gate width (see the U.S. Pat. No. 5,111,157, for example).

The multi-stage high-output amplifiers using the unit FETs with the multi-finger structure are increased in chip size with increase in the number of unit FETs disposed in parallel for achieving a large output. Specifically the chip size increases due to large regions occupied by the unit FETs and regions occupied by the dividers, combiners, and impedance matching circuits disposed between the stages.

To achieve a small chip size, small via holes are formed respectively on the source electrodes of each unit FET, for example. Alternatively, via holes are shared by a plurality of unit FETs to decrease the number of via holes. Decreasing the number of via holes, however, increases the ground inductance and also causes variations in gain among the unit FETs, hence leading to a poor balance of the amplifier as a whole. Thus, high-output amplifiers have a problem that loop oscillation is likely to occur.

DETAILED DESCRIPTION

A semiconductor power amplifier of an embodiment includes; a plurality of unit FETs disposed in parallel in a direction of a substantially straight line connecting source electrodes of the unit FETs; a first via hole which connects the two source electrodes positioned between adjacent ones of the unit FETs in common and an RF ground electrode; and a second via hole which connects the source electrode on a side having no adjacent unit FET and the RF ground electrode. Each unit FET includes; a gate electrode which is connected to gate finger electrodes and leads out the gate finger electrodes in a longitudinal direction thereof; a drain electrode which is connected to drain finger electrodes disposed facing the gate finger electrodes and leads out the drain finger electrodes in a longitudinal direction thereof; and two source electrodes which are connected to source finger electrodes disposed facing the gate finger electrodes and lead out the source finger electrodes to opposing sides in a widthwise direction thereof.

Figure 1A:
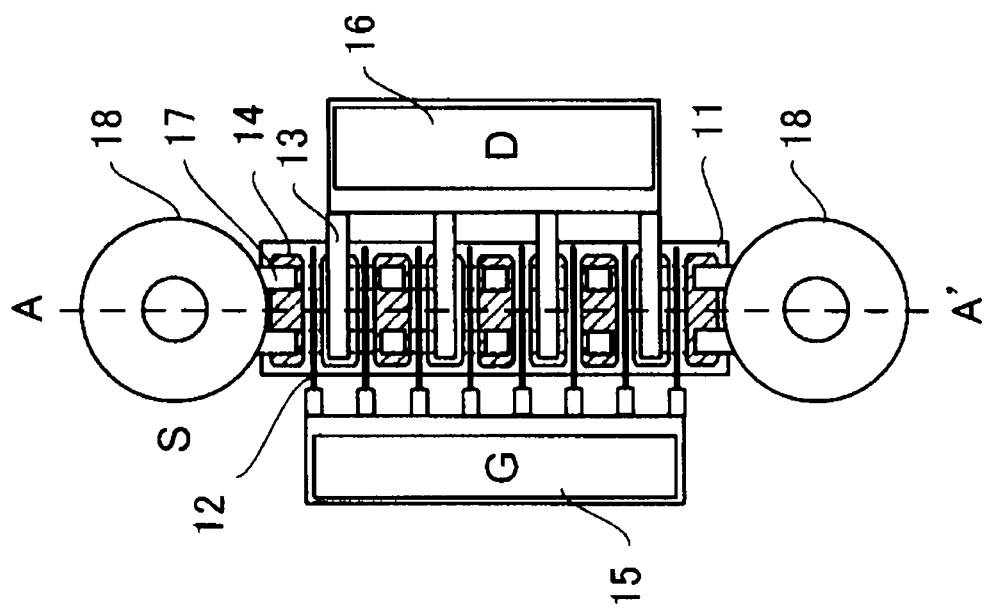
FIG. 1A is a configuration diagram of each multi-finger unit FET in a first embodiment.
Figure 1B:
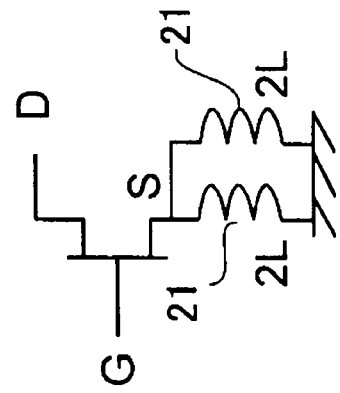
FIG. 1B shows an equivalent circuit of the unit FET in FIG. 1A.
Figure 2:
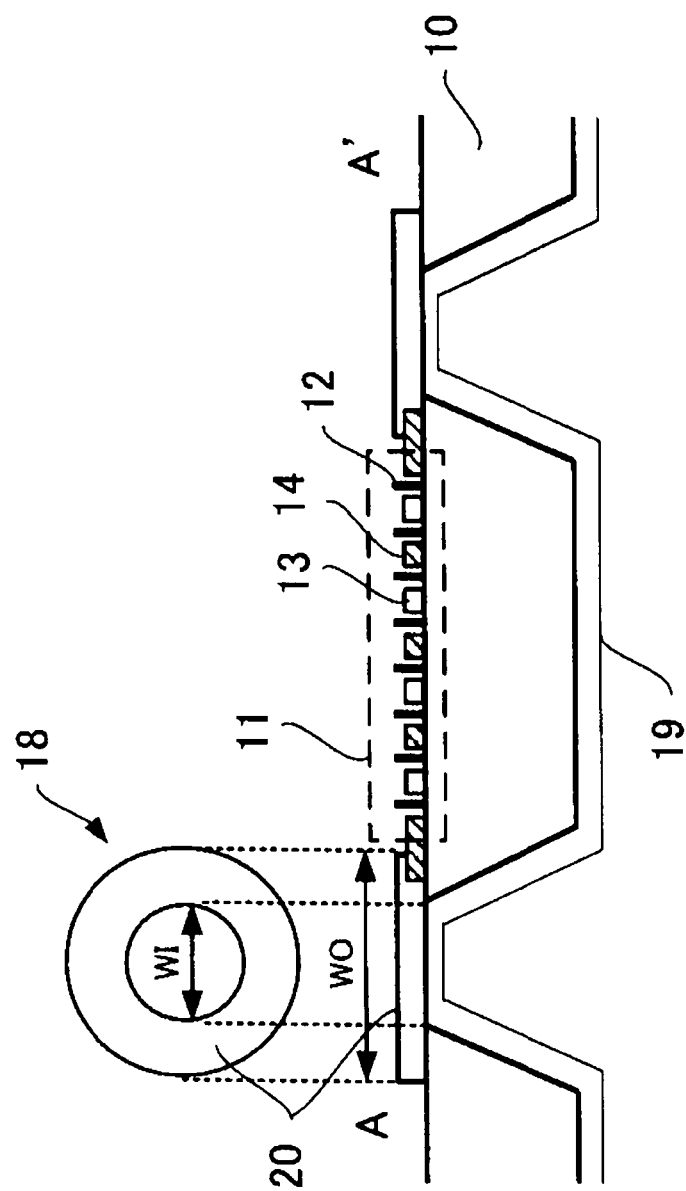
FIG. 2 is a cross-sectional view taken along the A-A' line in FIG. 1A.

Hereinbelow, embodiments will be described in detail with reference to FIGS. 1A to 9. FIG. 1A shows a configuration diagram of each unit FET of the embodiments, and FIG. 1B shows an equivalent circuit thereof. Also, FIG. 2 shows a cross-sectional view taken along the A-A' line shown in FIG. 1A. The unit FET of the embodiments is a multi-finger FET. On an active region 11 formed on a semi-insulating semiconductor substrate 10, a plurality of gate finger electrodes 12 in a comb teeth shape are formed, and a plurality of drain finger electrodes 13 and a plurality of source finger electrodes 14 are formed alternately, facing each other with the gate finger electrodes 12 therebetween. Note that FIG. 2 does not illustrate details of the internal structure of the active region 11 constructing the unit FET.

Moreover, a gate electrode 15, a drain electrode 16, and source electrodes 17 are formed. The gate electrode 15 is connected to the plurality of gate finger electrodes 12 and leads out the plurality of gate finger electrodes 12 in the longitudinal direction (gate length direction) thereof. The drain electrode 16 is connected to the plurality of drain finger electrodes 13 and leads out the plurality of drain finger electrodes 13 in the longitudinal direction thereof. The two source electrodes 17 are connected to the plurality of source finger electrodes 14 and lead out the plurality of source finger electrodes 14 to opposing sides in the widthwise direction thereof. Via holes 18 are formed on the source electrodes 17. As shown in FIG. 2, the via holes 18 are connected to both the source electrodes 17 of the unit FET and a back-side electrode 19 functioning as an RF ground electrode. Via hole pads 20 and the source electrodes 17 are connected to each other. A via hole pad diameter is W0 while a via hole diameter with which the back-side electrode 19 is connected is W1. The via hole pads 20 are connected to the back-side electrode 19 formed on through-holes penetrating through the semi-insulating semiconductor substrate 10.

These via holes 18 have a parasitic inductance. As shown in FIG. 1B, when the via holes 18 of the unit FET are expressed by inductors 21, respectively, the two inductors 21 connected in parallel are placed between the source electrode S and the ground. Here, when the inductance of the via hole 18 is 2L, then the ground inductance of the unit FET is L because the two inductors 21 of 2L are connected in parallel.

To achieve a high output with a single unit FET, it is necessary to increase the gate length, the gate width, and the like. In multi-finger FETs, the number of fingers may be increased to achieve a large, equivalent gate width, and there is therefore an advantage that a high output can be achieved without sacrificing RF characteristics. However, increasing the number of fingers increases the width of the unit FET.

When a semiconductor power amplifier is configured using a common-source circuit having a high input impedance, providing a high gain, it is necessary to take into full consideration the ground inductance of the multi-finger FET. That is, the ground points of the via holes, the sizes of the via holes, and the like need to be taken into full consideration. It has been known that a large ground inductance of a source electrode decreases the gain accordingly. Moreover, in parallel drive of a plurality of unit FETs in phase with each other, differences in the ground inductances of the unit FETs causes differences in phase characteristics attributable to variations in gain, whereby unstable poles are generated. For this reason, semiconductor power amplifiers are likely to experience loop oscillation.

Figure 3A:
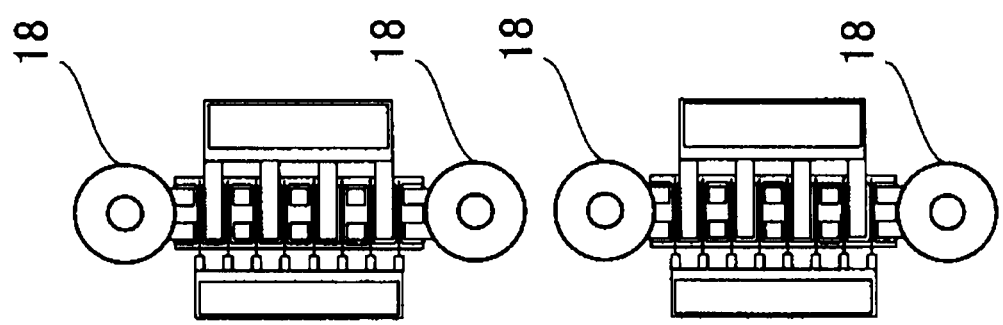
FIG. 3A shows an example where via holes are disposed independently of each other in a configuration where the unit FETs are driven in parallel.
Figure 3B:
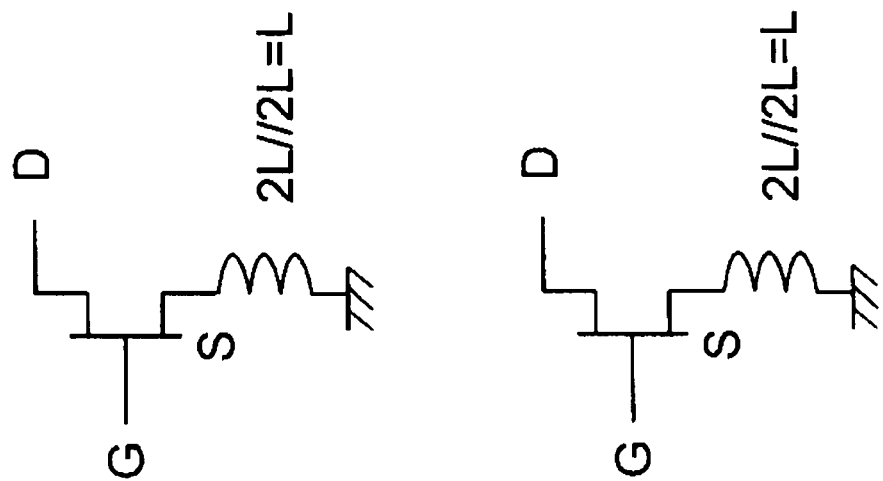
FIG. 3B shows equivalent circuits of the unit FETs in FIG. 3A, respectively.

FIGS. 3A and 3B show an example of parallel drive of unit FETs. Via holes independent of each other are disposed on the source electrodes of each unit FET, respectively. Each via hole 18 in FIG. 3A is the same as the via holes 18 in FIGS. 1A and 1B, having the via hole pad diameter WO, the via hole diameter WI, and the inductance 2L. Here, this via hole is defined as a reference via hole. In this configuration, as shown in FIG. 3B, the ground inductance of each unit FET is L, and therefore the ground inductances of the two unit FETs are equal to each other.

Figure 4B:
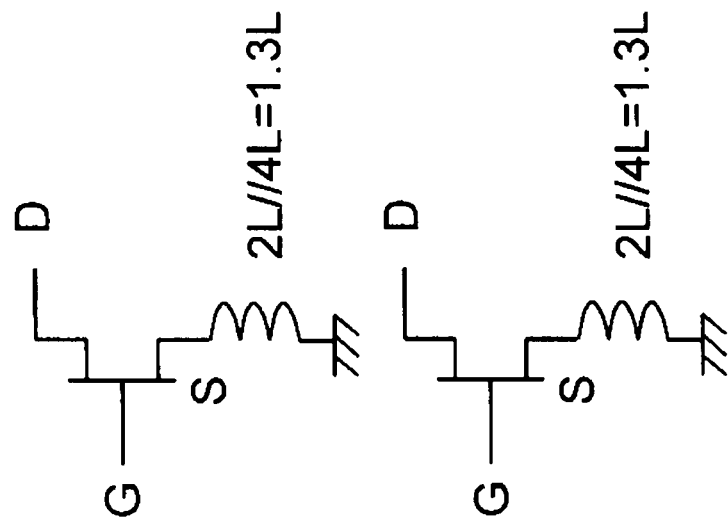
FIG. 4B shows equivalent circuits of the unit FETs in FIG. 4A, respectively.
Figure 4A:
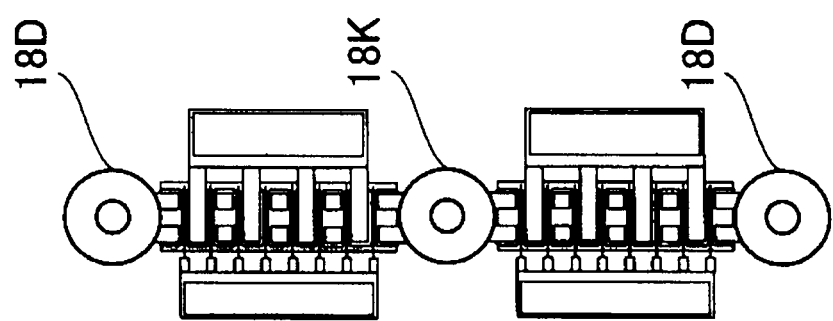
FIG. 4A shows an example where a shared via hole is disposed in the configuration where the unit FETs are driven in parallel.

FIGS. 4A and 4B show another example of parallel drive of unit FETs. To avoid a large chip size, a via hole shared by the two unit FETs is disposed on the source electrodes of the two unit FETs. In this configuration, the via hole shared by the two unit FETs is a shared via hole 18K while via holes provided exclusively to the unit FETs are independent via holes 18D. The inductance of each independent via hole 18D and the inductance of the shared via hole 18K are both 2L. The inductance of the shared via hole 18K per unit FET is 4L. Thus, as shown in the equivalent circuits in FIG. 4B, the ground inductance of each unit FET is 1.3 L.

As described above, when the number of unit FETs to be driven in parallel is two, the ground inductances of the unit FETs are equal to each other and therefore the problem of loop oscillation will not occur, for both cases of the parallel drive of the unit FETs shown in FIGS. 3A and 4A. However, in the example of FIG. 4A, the ground impedance of each unit FET is larger than that of the example in FIG. 3A, thus decreasing the gain. To prevent the decrease in gain, it is effective to decrease the inductance of the shared via hole 18K.

That is, to decrease the inductance of the shared via hole 18K, a via hole having a via hole diameter larger than the via hole diameter WI of the reference via hole may be disposed. Specifically, the via hole diameter WI is preferably set to such a diameter that the inductance may be L.

In a case where the via hole pad diameter WO is fixed, the via hole diameter WI cannot be any larger than the via hole pad diameter WO, and hence the via hole diameter WI is determined appropriately with the unit FETs' operating current and the like taken into consideration. Increasing the via hole diameter WI allows compensation for the decrease in gain to some extent.

Meanwhile, since the decrease in gain does not cause the problem of loop oscillation, the via hole diameter WI may be left unadjusted, and the gain compensation may be performed in a subsequent, amplification stage.

Figure 5:
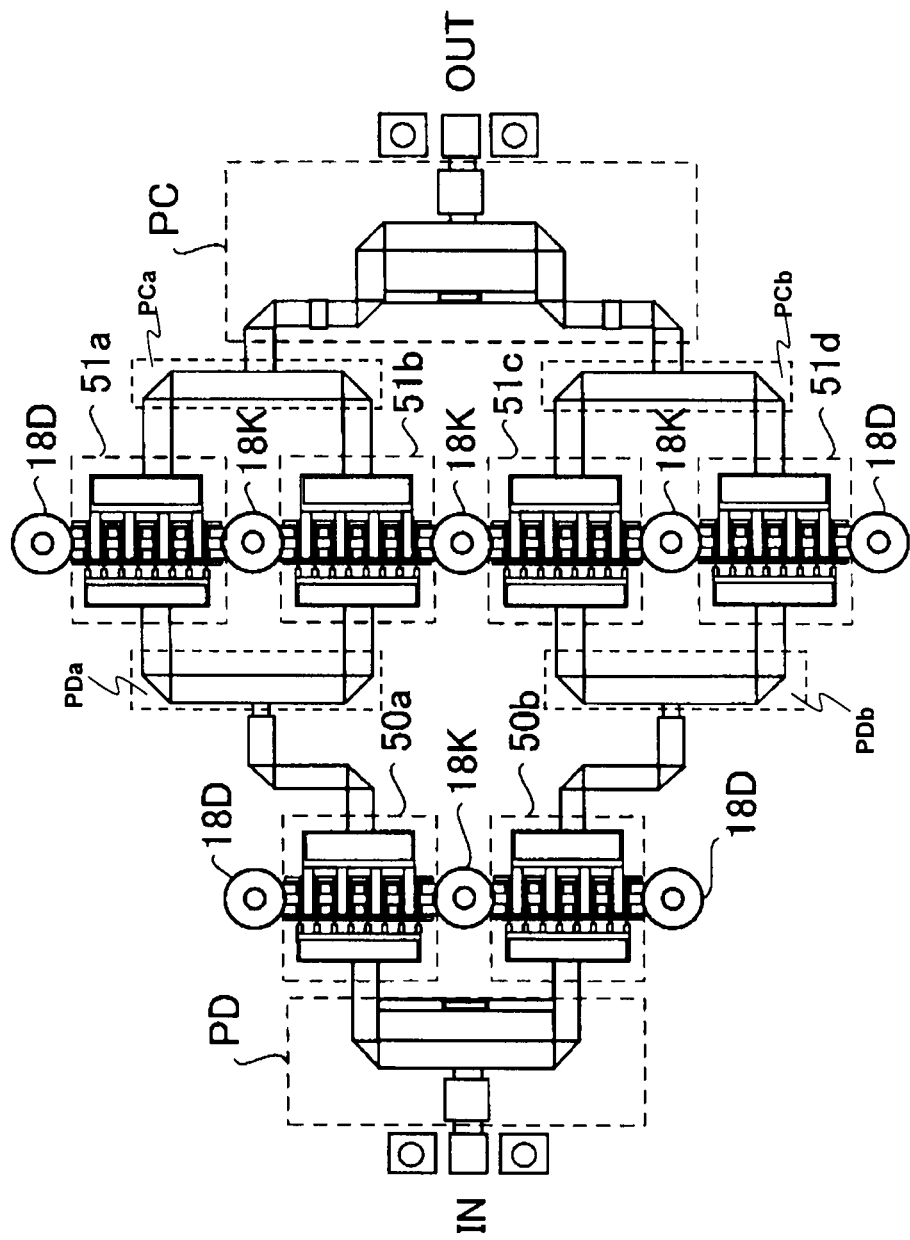
FIG. 5 shows an example configuration of a power amplifier with a two-stage-four-branch structure.
Figure 6:
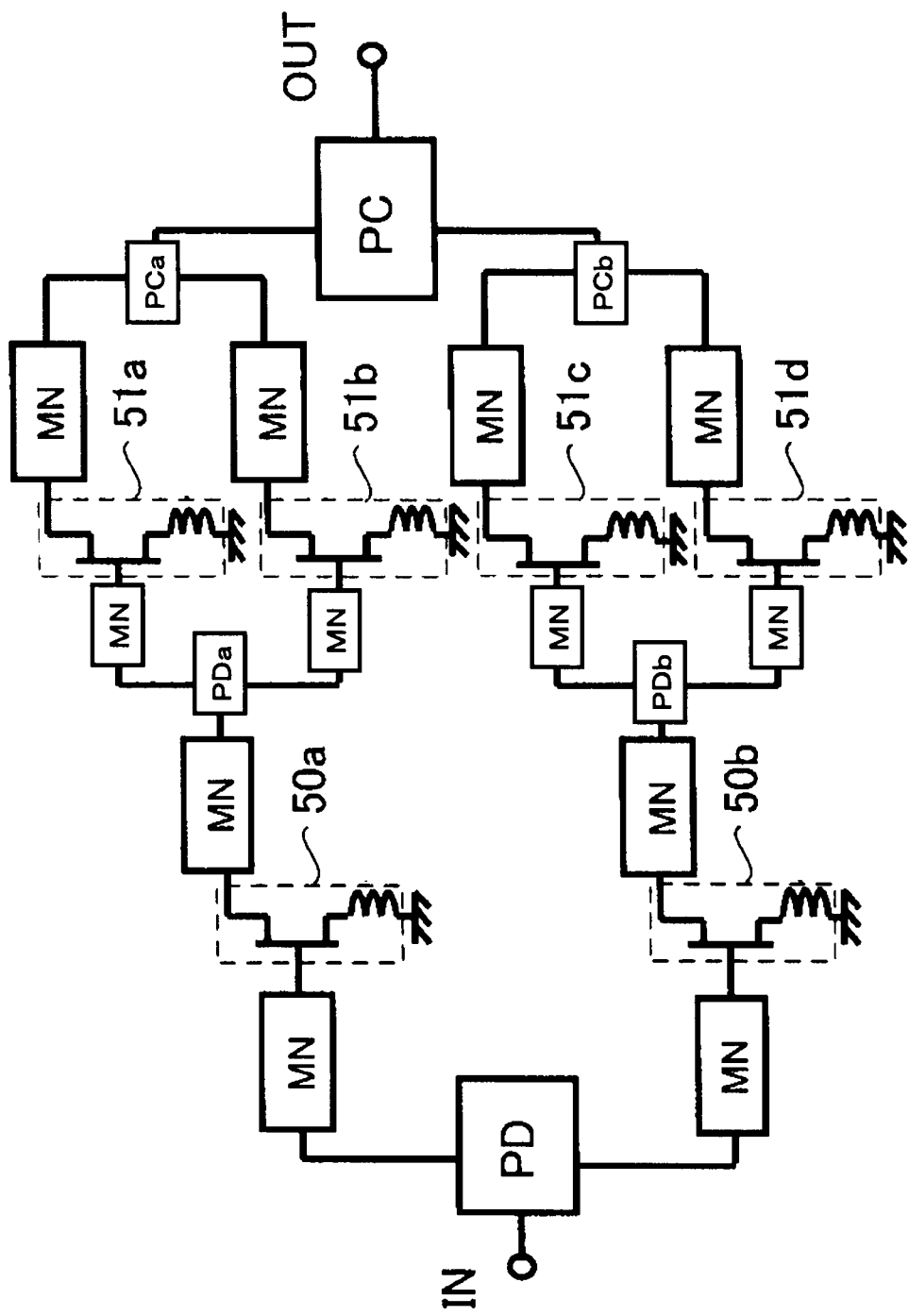
FIG. 6 shows an equivalent circuit of the power amplifier with the two-stage-four-branch structure.

FIG. 5 is an example configuration of a semiconductor power amplifier with a two-stage-four-branch structure, and FIG. 6 is an equivalent circuit thereof. An RF signal inputted from an input terminal IN is divided into two RF signals by a divider PD and amplified in parallel by two unit FETs 50a and 50b, respectively. The RF signal amplified by the unit FET 50a is divided into two RF signals by a divider PDa and amplified in parallel by two unit FETs 51a and 51b, respectively. The RF signal amplified by the unit FET 50b is divided into two RF signals by a divider PDb and amplified in parallel by two unit FETs 51c and 51d, respectively. The output signals from the unit FETs 51a and 51b are combined by a combiner PCa. The output signals from the unit FETs 51c and 51d are combined by a combiner PCb. The four output signals outputted from the unit FETs 51a, 51b, 51c, and 51d are finally combined by a combiner PC and outputted. Matching circuits MN, each formed of a line, a resistor, an inductor, a capacitor, and the like, are inserted at an input side and an output side of each of the unit FETs 50a, 50b, 51a, 51b, 51c, and 51d for impedance matching in frequency bands to be used.

As shown in FIG. 5, in the semiconductor power amplifier, each of the unit FETs 50a, 50b, 51a, 51b, 51c, and 51d has the independent via hole 18D or the shared via hole 18K on each side thereof. The shared via hole 18K is disposed between the adjacent two unit FETs. Thus, the shared via hole 18K is disposed between the unit FETs 50a and 50b, and the independent via hole 18D is disposed on the other end of each of the unit FETs 50a and 50b. Moreover, the common via hole 18K is disposed on both ends of each of the unit FETs 51b and 51c. The independent via hole 18D is disposed on one end of each of the unit FETs 51a and 51b. The shared via hole 18K is disposed on the other end of each of the unit FETs 51a and 51b.

In this configuration, the inductance of each independent via hole 18D and the inductance of each shared via hole 18K are 2L. The inductance of the share via hole 18K per unit FET is 4L, and the ground inductance of each of the unit FETs 50a, 50b, 51a, and 51d is 1.3 L because the inductor of 2L and the inductor of 4L are connected in parallel.

Meanwhile, the ground inductance of each of the unit FETs 51b and 51c is 2L. That is, the inductance of the shared via hole 18K per unit FET is 4L, and two inductors of 4L are connected in parallel.

In this case, a difference in the ground inductances of the unit FETs driven in parallel causes variations in gain and phase characteristics and leads to a poor balance between the unit FETs. Consequently, loop oscillation may possibly occur. Such a situation occurs when three or more unit FETs are driven in parallel.

As described above, the ground inductance of each unit FET is greatly affected by the inductances of the via holes 18 used therefor. In this respect, in the semiconductor power amplifier of each of the embodiments, the ground inductances of the unit FETs are set equal to each other to prevent loop oscillation.

First Embodiment

Figure 7:
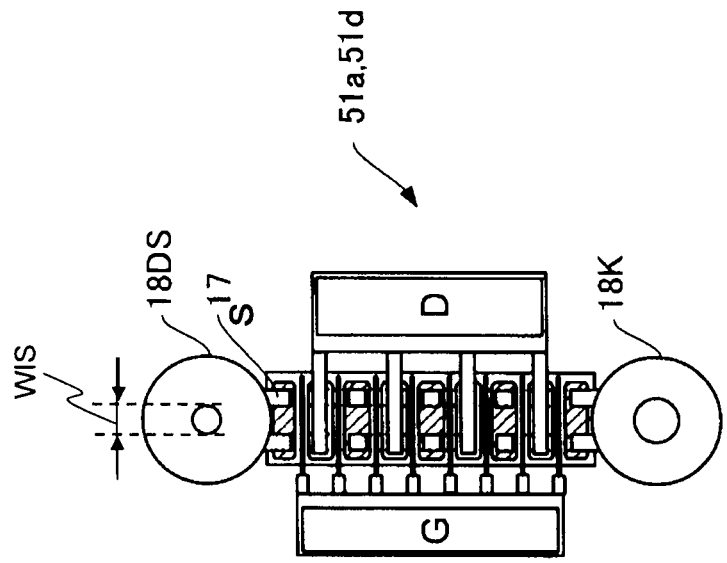
FIG. 7 shows an example of an inductor wiring added to one of the via holes of some unit FETs.

A semiconductor power amplifier of this embodiment is the semiconductor power amplifier shown in FIGS. 5 and 6 in which an inductor wiring is added between the source electrode of each of the unit FETs 51*a* and 51*d* and the independent via hole 18D connected to the source electrode. FIG. 7 shows an example configuration of each of the unit FETs 51*a* and 51*d* including the independent via hole 18D and the shared via hole 18K. The inductance of the independent via hole 18D is equal to the inductance of the shared via hole 18K. To make the ground inductances of the unit FETs 51*a* and 51*d* equal to the ground inductances of the unit FETs 51*b* and 51*c*, an inductor wiring 71 is provided between the independent via hole 18D and its corresponding source electrode 17.

The inductor wiring 71 is preferably configured to be thin within a range within which the amount of the operating current of the unit FET may be satisfied. Further, the inductor wiring 71 is preferably configured to have such a line length that the inductance from the source electrode 17 to the ground plane may be 4L. Thus, the inductance of the inductor wiring is preferably 2L. With the inductor wiring 71 thus configured, the ground inductance of each of the unit FETs 51*a* and 51*d* becomes 2L and is therefore set to the same ground inductance as those of the unit FETs 51*c* and 51*d*.

Thus, in the first embodiment, since the ground inductances of the unit FETs 51*a*, 51*b*, 51*c*, and 51*d* at the second stage are all equal to each other, their gain characteristics and phase characteristics are equal to each other. Accordingly, the stability is improved, and a semiconductor power amplifier capable of preventing loop oscillation can be obtained.

Second Embodiment

Figure 8:
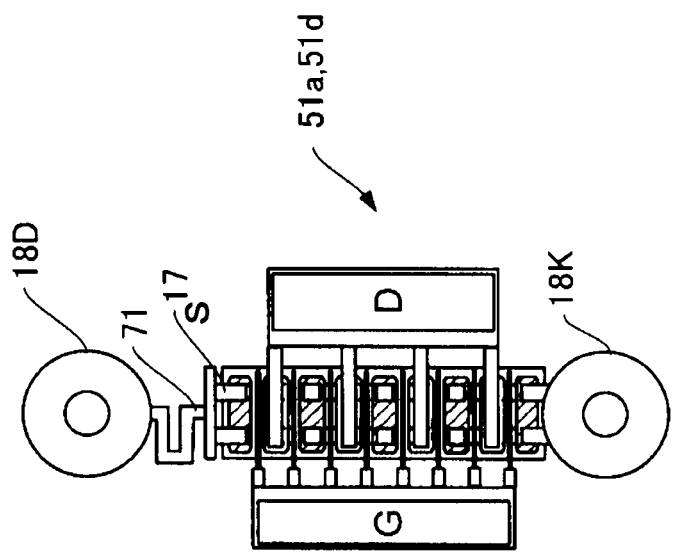
FIG. 8 shows an example of the independent via holes of some unit FETs in a second embodiment with a smaller diameter.

A semiconductor power unit of this embodiment is the semiconductor power unit shown in FIGS. 5 and 6 in which the via hole diameters of the independent via holes 18D connected to the source electrodes of the unit FETs 51*a* and 51*d* are smaller than the via hole diameters of their shared via holes 18K. FIG. 8 shows an example configuration of each of the unit FETs 51*a* and 51*d* including the independent via hole 18DS and the shared via hole 18K. To make their ground inductances equal to the ground inductances of the unit FETs 51*b* and 51*c*, an independent via hole 18DS having a via hole diameter WIS smaller than the reference via hole diameter WI is disposed as the independent via hole. Accordingly, the inductance of the independent via hole 18DS is larger than that of the shared via hole 18K.

The via hole diameter WIS of the independent via hole 18DS is set small within a range within which the inductance thereof may be 4L but the amount of the operating current of the unit FET may still be satisfied. With the independent via hole 18DS thus configured, the ground inductance of the unit FET becomes 2L and is therefore set to the same ground inductance as those of the unit FETs 51*c* and 51*d*.

Thus, in the second embodiment, since the ground inductances of the unit FETs 51*a*, 51*b*, 51*c*, and 51*d* at the second stage are all 2L and equal to each other, their gain characteristics and phase characteristics are equal to each other. Accordingly, the stability is improved, and a semiconductor power amplifier capable of preventing loop oscillation can be obtained.

Further, in addition to the first embodiment, there is an allowance in the chip layout since the inductor wiring 71 is not used. Moreover, the same chip layout as conventional ones can be provided since there is no need to increase the via hole pad diameter WO.

Third Embodiment

Figure 9:
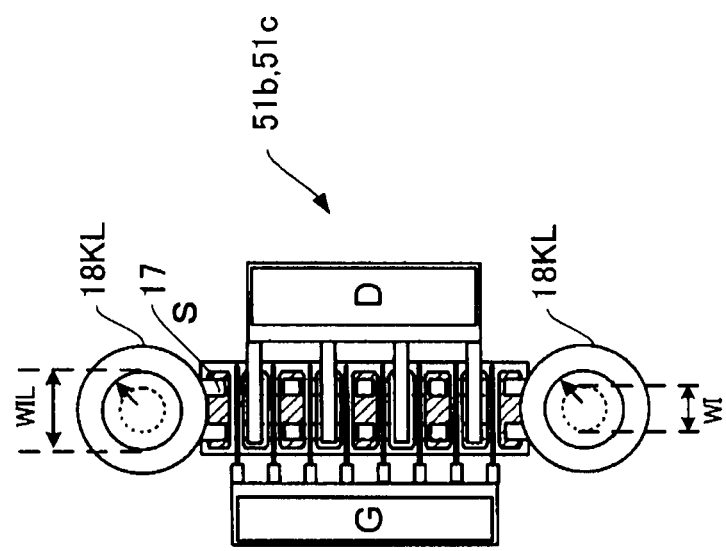
FIG. 9 shows an example of the shared via holes of some unit FETs in a third embodiment with a larger diameter.

A semiconductor power amplifier of this embodiment is the semiconductor power amplifier shown in FIGS. 5 and 6 in which the via hole diameters of the shared via holes 18K connected to the source electrodes of the unit FETs 51*a*, 51*b*, 51*c*, and 51*d* are larger than the via hole diameters of the independent via holes 18D. FIG. 9 shows an example configuration of each of the unit FETs 51*b* and 51*c* having the shared via holes 18KL on the source electrodes 17 at both sides. To make the ground inductances of the unit FETs 51*a*, 51*b*, 51*c*, and 51*d* equal to each other, a shared via hole 18KL having a via hole diameter WIL larger than the reference via hole diameter WI is disposed as the shared via hole. Accordingly, the inductance of the independent via hole 18D is larger than that of the shared via hole 18KL.

The via hole diameter WIL of the shared via hole 18KL is made large so that the inductance may be L. With the shared via hole 18KL thus configured, the ground inductances of the unit FETs 51*a*, 51*b*, 51*c*, and 51*d* are all set to L.

Thus, in the third embodiment, since the ground inductances of the unit FETs 51*a*, 51*b*, 51*c*, and 51*d* at the second stage are all equal to each other, their gain characteristics and phase characteristics are equal to each other. Accordingly, the stability is improved, and a semiconductor power amplifier capable of preventing loop oscillation can be obtained.

Further, in addition to the second embodiment, an improvement in stability and also an improvement in gain can be achieved since the ground inductances of the all the unit FETs can be decreased without increasing the via hole pad diameter WO.

Meanwhile, the reference via hole mentioned above preferably has such a via hole diameter WI and a via hole pad diameter WO that the amount of inductance can be adjusted within a range from L to 4L.

Moreover, although the via holes are described as having a circular shape, the shape does not necessarily have to be circular.

According to the embodiments described above, it is possible to provide a semiconductor power amplifier in which loop oscillation is unlikely to occur even when the number of via holes is reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor power amplifier comprising:
a plurality of unit FETs which are disposed in parallel in a direction of a substantially straight line connecting source electrodes of the unit FETs, each of the unit FETs including
a gate electrode which is connected to gate finger electrodes and leads out the gate finger electrodes in a longitudinal direction thereof,
a drain electrode which is connected to drain finger electrodes disposed facing the gate finger electrodes and leads out the drain finger electrodes in a longitudinal direction thereof, and
two source electrodes which are connected to source finger electrodes disposed facing the gate finger electrodes and lead out the source finger electrodes to opposing sides in a widthwise direction thereof;

a first via hole which connects both of the two source electrodes positioned between adjacent ones of the unit FETs in common and an RF ground electrode; and a second via hole which is adjacent to only one source electrode and which connects the only one source electrode and the RF ground electrode.

2. The semiconductor power amplifier according to claim 1, wherein inductance of the second via hole is larger than that of the first via hole.

3. The semiconductor power amplifier according to claim 2, wherein a via hole diameter of the second via hole is larger than a via hole diameter of the first via hole.

4. The semiconductor power amplifier according to claim 1, wherein a via hole pad of the first via hole is disposed on the two source electrodes positioned between the adjacent ones of the unit FETs.

5. The semiconductor power amplifier according to claim 4, wherein a via hole pad of the second via hole is disposed on the source electrode which is adjacent to only the second via hole.

6. The semiconductor power amplifier according to claim 1, wherein an inductor wiring having an inductor component is provided between the second via hole and the source electrode to be connected to the second via hole.

7. The semiconductor power amplifier according to claim 6, wherein a via hole diameter of the first via hole and a via hole diameter of the second via hole are equal to each other.

8. The semiconductor power amplifier according to claim 1, wherein the number of the unit FETs disposed in parallel is three or more.

9. The semiconductor power amplifier according to claim 1, wherein the ground inductances of the plurality of unit FETs are equal to each other.

* * * * *